United States Patent [19]

Ragle et al.

[11] Patent Number: 4,891,815
[45] Date of Patent: Jan. 2, 1990

[54] BULK AVALANCHE SEMICONDUCTOR LASER

[75] Inventors: Larry O. Ragle, Palo Alto; Stephen J. Davis, San Francisco, both of Calif.

[73] Assignee: Power Spectra, Inc., Fremont, Calif.

[21] Appl. No.: 108,191

[22] Filed: Oct. 13, 1987

[51] Int. Cl.[4] .............................................. H01S 3/19
[52] U.S. Cl. ...................................... 372/44; 372/46; 372/49
[58] Field of Search ...................... 372/43, 44, 46, 49, 372/70, 75, 98, 99

[56] References Cited

U.S. PATENT DOCUMENTS

| | | | |
|---|---|---|---|
| 3,510,795 | 5/1970 | Winstel | 372/49 |
| 3,872,400 | 3/1975 | Glausecker et al. | 372/44 |
| 3,886,579 | 5/1975 | Ohuchi et al. | 357/13 |
| 3,953,809 | 4/1976 | Kawamoto et al. | 372/44 |
| 4,218,618 | 8/1980 | Mourou | 250/211 J |
| 4,301,362 | 11/1981 | Mourou | 250/211 J |
| 4,316,156 | 2/1982 | Scifres et al. | 372/50 |
| 4,347,437 | 8/1982 | Mourou | 250/211 R |
| 4,368,385 | 1/1983 | Kanbe et al. | 250/211 J |
| 4,438,331 | 3/1984 | Davis | 250/211 J |
| 4,555,785 | 11/1985 | Scifres et al. | 372/8 |
| 4,782,222 | 11/1988 | Ragle et al. | 250/211 J |

OTHER PUBLICATIONS

Roxlo et al.; "Turnable . . . Platelet Laser", Appl. Phys. Lett., 38 (7); Apr. 1, 1961; pp. 507-509.
Weiser et al.; "Evidence for Avalanche . . . P-Type GaAs"; Appl. Phys. Lett., 7(8); Oct. 15, 1965; pp. 225-228.
Southgate; "Recombination Processes . . . Gallium Arsenide"; J. of Appl. Phys., 38(12); Nov. 1967; pp. 4589-4595.
"Optically Pumped Room-Temperature GaAs Lasers", Stephen R. Chinn et al., IEEE Journal of Quantum Electronics, vol. QE-9, No. 2, Feb. 1973; pp. 294-300.
"Optically Excited Bulk Semiconductor Lasers", Carl J. Magee et al., IEEE Journal of Quantum Electronics, vol. QE-6, No. 6, Jun. 1970; pp. 392-400.
"Stimulated Emission from Bulk Field-Ionized GaAs", P. D. Southgate, IEEE Journal of Quantum Electronics, vol. QE-4, No. 4, Apr. 1968; pp. 179-185.
"Laser Action in Field-Ionized Bulk GaAs*", P. D. Southgate, Applied Physics Letters, vol. 12, No. 3, Feb. 1, 1968; pp. 61-63.

Primary Examiner—William L. Sikes
Assistant Examiner—Georgia Y. Epps
Attorney, Agent, or Firm—Townsend & Townsend

[57] ABSTRACT

A bulk semiconductor laser which uses optically triggered avalanche conduction to initiate the lasing action in the bulk. A semiconductor block has electrodes coupled on opposing sides and a high voltage is applied across the electrodes which is less than the voltage required for avalanche breakdown. The block is irradiated with light which produces charge carriers in the block to initiate avalanche conduction, which results in a large number of charge carriers. The charge carriers recombine to generate a second amount of electromagnetic radiation. This radiation is reflected back into the block on two opposing sides, thus resulting in a laser emission.

25 Claims, 4 Drawing Sheets

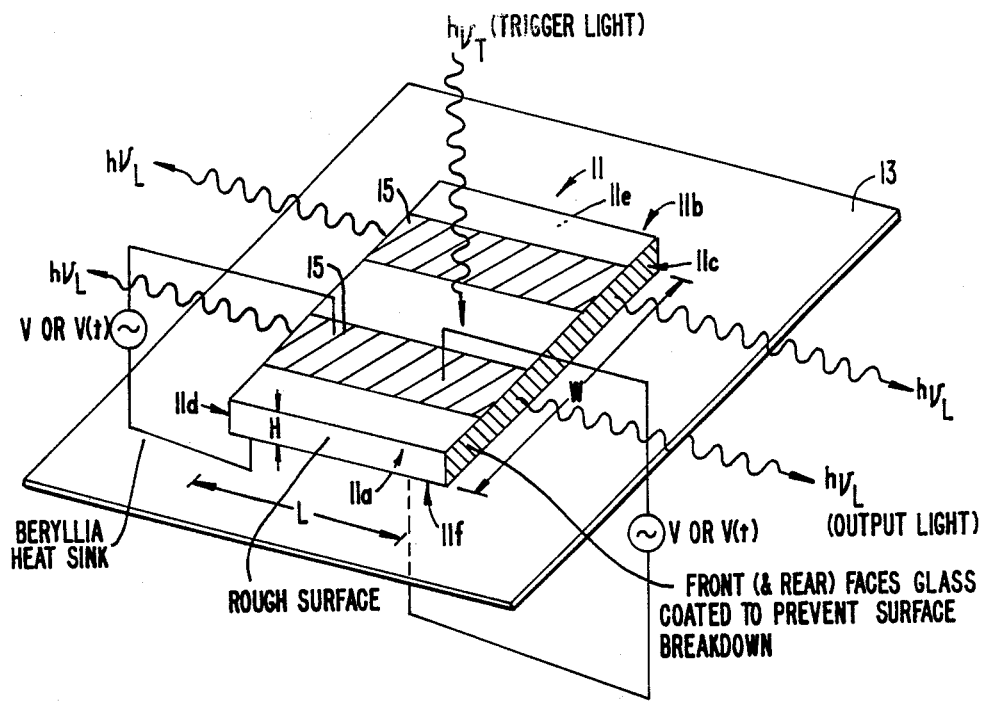
FIG._1.
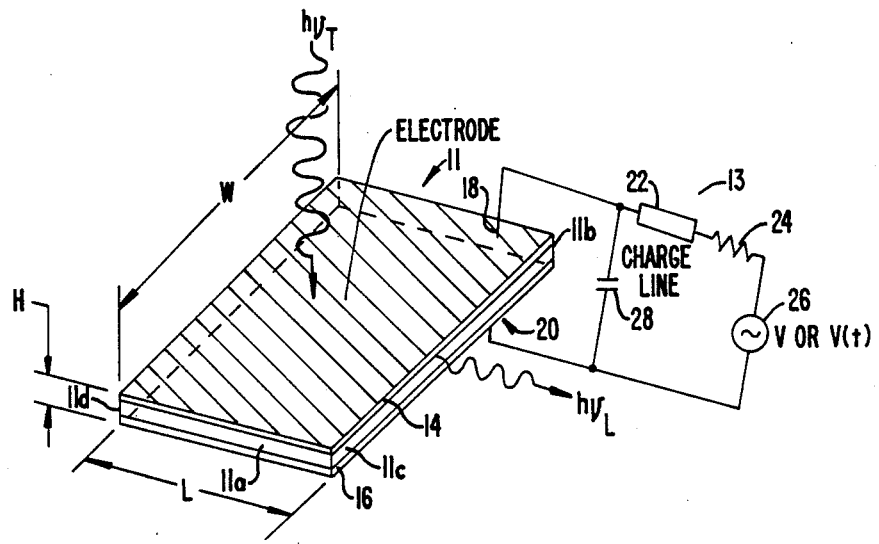
FIG._2.

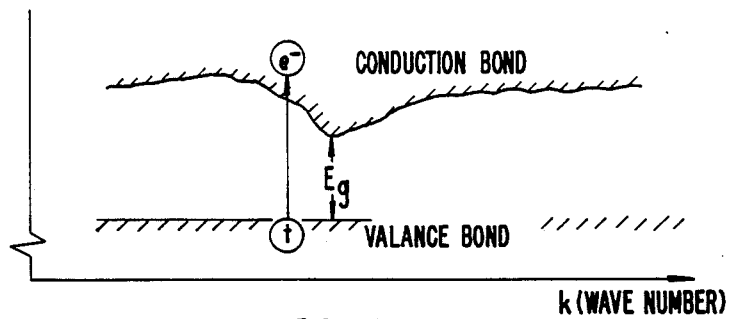
FIG._3.
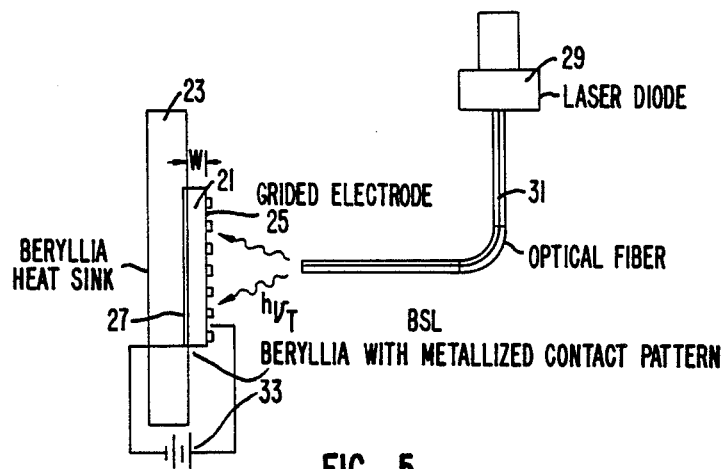
FIG._5.
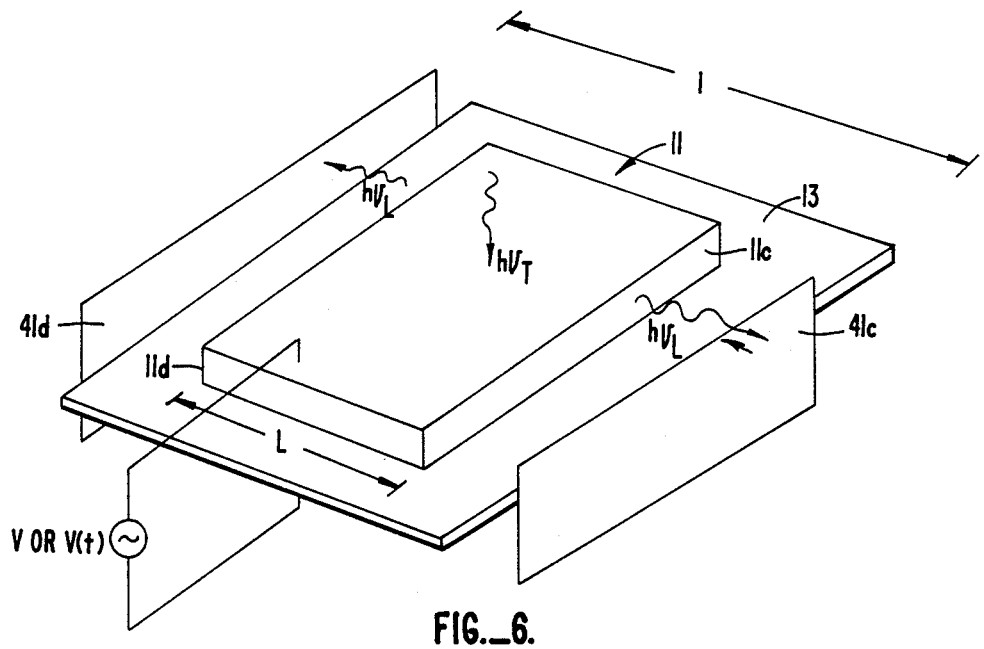
FIG._6.

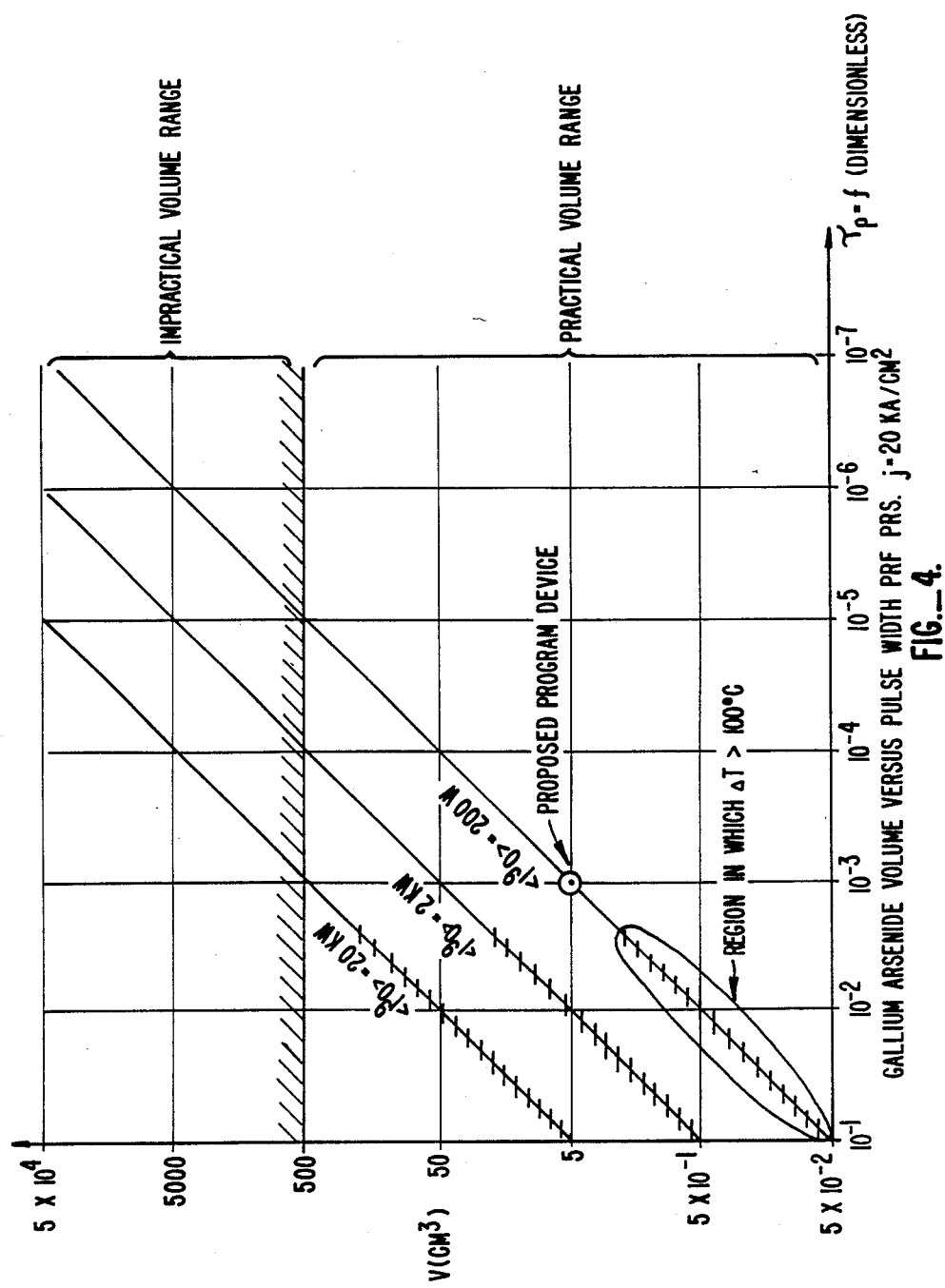

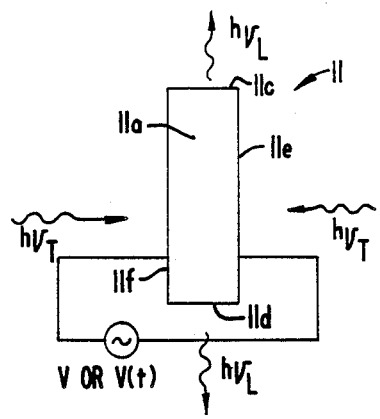
FIG._7.
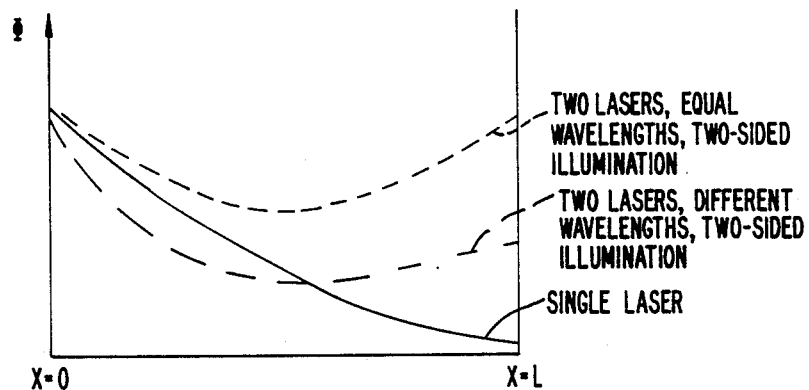
FIG._8.

BULK AVALANCHE SEMICONDUCTOR LASER

A related application is entitled "Bulk Avalanche Semiconductor Switch Using Field Compression," Ser. No. 092,487, filed Sept. 3, 1987 now U.S. Pat. No. 4,782,222.

BACKGROUND

This invention relates to the production of laser radiation throughout the volume or bulk of a semiconducting material.

Conventional junction semiconductor lasers, such as the GaAlAs laser diode produced by Laser Diode, Inc., generate laser radiation with about 15 milliwatts average radiative power delivered at a peak intensity wavelength of around 850 nanometers (nm), with external quantum efficiency of about four percent; average power dissipated is around 375 milliwatts. Some of these performance limitations arise from the nature of the junction semiconductor laser itself, wherein the laser radiation is generated only in or adjacent to the thin, small volume depletion layer formed near the common boundary of the n-type and p-type materials that comprise the semiconductor.

A bulk semiconductor laser that produces radiation of an appropriate wavelength substantially throughout the bulk or volume of the semiconductor material would be an attractive alternative to the junction semiconductor laser and certain solid state and gas lasers as well. The average radiative power delivered by a bulk device could be at least four orders of magnitude higher than the average power delivered by the junction device, and the external quantum efficiency could be improved by a factor of about five.

In 1959, Basov, Vul and Popov predicted that bulk laser action in silicon and germanium could be promoted by applying sufficient voltage across the semiconductor material to cause avalanche breakdown. No experiments have ever verified this, because the rates of radiative recombination in silicon and germanium are relatively low compared to those of competing non-radiative processes.

In Jour. of Appl. Physics 38 (1968) 4589 Southgate reported what he believed was semiconductor laser operation in bulk, using the rather poor quality gallium arsenide material available at that time. Southgate applied a high voltage across the bulk semiconductor to achieve avalanche breakdown. The recombining electrons (from the avalanche conduction) emitted photons. Southgate's device had very low efficiency (less than 0.01 percent) and operated at an average electric field of 3,000 volts/cm within the bulk. A device operated at such field values will have difficulty attaining avalanche breakdown uniformly throughout the bulk, and self-absorption of photons generated within the bulk will dominate the radiative processes and reduce the efficiency by orders of magnitude.

In "Evidence for Avalanche Injection Laser in p-Type GaAs," Appl. Phys. Lett. 7 (1965) 225, Weiser and Woods reported the experimental observation of laser action induced by avalanche breakdown in Mn-doped p-type GaAs into which Zn, an acceptor, was diffused a short distance from each end of the GaAs block. Sharp voltage drops occurred across the Mn-Zn common boundary regions, which were each about 5 micrometers ($\mu m$) thick Above a critical end-to-end voltage of 11–15 volts that depends upon ambient temperature ($T = 4.2–300°$ K.), the device manifests negative resistance and radiation is promptly emitted at or around wavelengths $\lambda = 840$ nm and 890 nm, corresponding to electron recombination on a Zn center and a Mn center, respectively, at temperature $T = 77°$ K. The corresponding current density at $T = 77°$ K. was estimated at $10^4$ Amps/cm$^2$. The authors note that the severe heating problem forces them to use voltage pulses of time duration 0.1 usec or shorter.

An optically pumped bulk semiconductor laser, with uniform pumping assumed throughout the bulk, was examined theoretically by Magee and Haug in I.E.E.E. Jour. of Quantum Electronics QE-6 (1970) 392–400. By directing a laser at the bulk semiconductor material, photogenerated charge carriers are produced. When these charge carriers recombine, they generate photons, which can give a lasing action with the proper structure. Their results predict a sharp rise, by two or more orders of magnitude, in power output from a thin platelet of solid GaAs for a small increase in pump intensity near threshold. This agrees in general with experimental results reported earlier by Basov, Grasyuk, Ehfimov and Kamulin in Soviet Physics-Solid State 9 (1967) 65–74, where a ruby laser was used to pump bulk GaAs maintained at liquid nitrogen temperatures.

Chinn, Rossi, Wolfe and Mooradian, in I.E.E.E. Jour. of Quantum Electronics QE-9 (1973) 294–300, report the pulsed operation of GaAs and Si-doped GaAs platelet lasers at wavelengths in the range $0.88\ \mu m < \lambda < 0.89\ \mu m$, using optical pumping radiation from GaAs, GaAlAs and GaAsP laser diodes, from a Raman-shifted ruby laser, and from a two-photon (pumping) Nd:YAG laser. Pump frequencies were varied from 25–80 meV above the bandgap energy, and the output power abruptly increased by a factor of about ten as the input power was raised from 20 to 30 watts. Maximum power efficiencies obtained from GaAs and Si-doped GaAs were 3.3 percent and 6.3 percent, respectively.

In Applied Physics Letters 38 (1981) 507–509, Roxlo, Bebelaar and Salour report operation of a tunable bulk CdS platelet laser, optically pumped by an Ar+ laser at $\lambda = 0.458$, 0.473, 0.476 and 0.488 $\mu m$. Pump thresholds as low as 25 mW (100 kW/cm$^2$) were found, and the power conversion efficiency was 10 percent. Generation of picosecond pulses from bulk GaAs and $CdS_{0.5}Se_{0.5}$ platelet lasers is discussed by Vaucher, Cao, Ling and Lee in I.E.E.E. Jour. of Quantum Electronics QE-18 (1982) 187–192. The laser was optically pumped by two-photon pulses of unspecified duration from a Nd:glass laser. This allowed a tuning range of 0.84–0.855 $\mu m$ for GaAs. At a pump intensity of 134 MW/cm$^2$, the amplified spontaneous emission increased abruptly by three orders of magnitude and the bandwidth simultaneously narrowed to 0.002 $\mu m$ for GaAs. Operating efficiency is not specified.

Bulk semiconductor switches which use avalanche breakdown are described in U.S. Pat. No. 4,347,437 to Mourou and U.S. Pat. No. 4,438,331 to Davis. These patents show the triggering of avalanche conduction in a bulk semiconductor by directing a laser trigger at the bulk semiconductor to initiate avalanche conduction with a high voltage applied across the bulk.

SUMMARY OF THE INVENTION

The present invention is a bulk semiconductor laser which uses optically triggered avalanche conduction to initiate the lasing action in the bulk. A semiconductor block has electrodes coupled on opposing sides and a high voltage is applied across the electrodes which is less than the voltage required for avalanche breakdown. The block is irradiated with light which produces charge carriers in the block to initiate avalanche conduction, which results in a large number of charge carriers. These charge carriers recombine to generate a second amount of electromagnetic radiation. This radiation is reflected back into the block on two opposing sides, thus resulting in a laser emission.

The necessary reflection is obtained at the semiconductor-to-air interface and can be enhanced by coating the opposing sides of the semiconductor block or by using external mirrored surfaces to reflect the light back into the block.

The avalanche conduction is preferably generated using field compression in the manner set forth in copending application Ser. No. 092,487, filed Sept. 3, 1987, now U.S. Pat. No. 4,782,222 and entitled "Bulk Avalanche Semiconductor Switch Using Field Compression", and incorporated herein by reference. The field compression effect is generated by using a laser to irradiate the block having a wavelength such that substantially all of the laser beam is absorbed within a distance less than the distance between the electrodes. This results in a photoconduction region extending to one of the adjacent electrodes which effectively reduces the spacing between the electrodes and thus increases the electric field sufficiently to generate a more uniform avalanche conduction.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a schematic view of one embodiment of a bulk semiconductor laser according to the present invention using a grid first electrode and a planar second electrode;

FIG. 2 is a simplified schematic view of a second embodiment of a bulk semiconductor laser according to the present invention using a transparent electrode;

FIG. 3 is a simplified schematic view of an energy gap positioned between a valence band and a conduction band;

FIG. 4 is a graph of the practical volume range for a bulk semiconductor laser with the gallium arsenide materials now available;

FIG. 5 is a schematic view of another embodiment of the invention that uses an optical fiber to illuminate the semiconductor block;

FIG. 6 is a schematic view of the embodiment of FIG. 1 in which external mirrors are used to form the optical cavity;

FIG. 7 is a schematic side view of a double-sided embodiment of the invention in which a laser beam is emitted from two sides; and FIG. 8 is a graph of total laser radiation flux that may be generated by illumination of the semiconductor block with one wavelength or two different laser wavelengths.

DESCRIPTION OF THE PREFERRED EMBODIMENTS

FIG. 1 shows one embodiment of the subject invention for a bulk avalanche semiconductor laser ("BASL"). A block 11 of substantially pure GaAs (dimensions: length L×width W×height H) is mounted on a thin slab of beryllia or other suitable material 13 that serves as a heat sink. The GaAs block may have two roughened side walls 11a and 11b to discourage monochromatic electromagnetic radiation emission normal to these planes; electromagnetic radiation of a predetermined frequency $\nu_L$ that is incident upon the side walls 11a and/or 11b will be substantially entirely absorbed, scattered or transmitted, but not reflected. The front and rear surfaces 11c and 11d are thinly coated with an insulating material, such as glass or other passivating material, to prevent surface breakdown on these surfaces. This might be accomplished by using a coating of material that is substantially transparent to electromagnetic radiation of frequency $\nu_L$ and has an associated band gap much larger than the band gap $E_g$ of the semiconductor block material ($E_g = 1.45$ eV for GaAs). This larger band gap will insure that the passivating material on side walls 11c and 11d will not break down with the electric field applied to the block 11.

The top and bottom surfaces of the GaAs block each has one or more ohmic contacts, with a static or time-varying electrical field of the order of $\epsilon = 20$–$400$ kvolts/cm imposed between the top and bottom contacts. The electrical field is preferably greater than one-tenth the D.C. avalanche breakdown voltage for said block between said top and bottom contacts and less than three times said D.C. avalanche breakdown voltage. At a predetermined time, a trigger pulse $h_T$ of electromagnetic radiation of wavelength $\lambda_T = c/\nu_T = 860$–$903$ nm propagates toward the top surface of the GaAs block 11. This pulse is partially transmitted into and through the block and initiates electrical s avalanche breakdown in the bulk or volume of the block; a pulse of charge flows from the top ohmic contacts to the bottom ohmic contacts, or vice versa. This also produces electron-hole pairs in the block volume, with recombination times of the order of 1 nsec or more in pure GaAs, with concomitant emission of recombination electromagnetic radiation $h\nu_L$ of wavelength $\lambda_L = c/\nu_L = 870$ nm.

In the more general case of direct transition III-V or II-VI semiconductor materials, the associated trigger pulse energy $h\nu_T$ is preferably chosen to be approximately 1–1.25 times the lowest bandgap energy $E_g$ associated with an actual valence-conduction transition for an electron. This choice should provide the most efficient absorption of the photons while allowing adequate energy difference to provide a large number of available conduction band transition sites. If the energy $h\nu_T$ is chosen too close to the actual energy bandgap $E_g$, the procrustean operation of the Pauli exclusion principle in the conduction and valence bands will severely limit the number of states available and will prevent the valence-conduction transition. Alternatively, two different trigger wavelengths may be used, as described below, to better control the local generation of conduction band electrons by the trigger pulse(s).

The electrodes used to impose a high electrical field across the bulk of the semiconductor block 11 may be a series of strips of non-infinitesimal width, running in one or two directions, as shown in FIG. 1. These strips must not cover the entire surface of the block 11 that is exposed to the trigger pulse energy $h\nu_T$, or the trigger pulse energy may be effectively prevented from reaching the block itself. A preferred approach for the electrode arrangement, shown in FIG. 1, provides an electrically conducting grid 15 as the electrode on one or both of the top and bottom surfaces of the block 11.

This approach allows substantially the maximum amount of trigger pulse energy $h\nu_T$ to reach the block, as the covering fraction of the electrode (total electrode projected area divided by area of surface exposed to radiation $h\nu_T$) may be varied from 0.05 –0.95. Alternatively, one may use a sheet of a partly transparent electrode such as tin or indium oxide (several microns thick) for one or two electrodes, as indicated in FIG. 2.

FIG. 2 shows an alternate embodiment using a PIN structure. GaAs block 11 of insulating material is covered with a layer of P+ material 14 on the top and a layer of N+ material 16 on the bottom. These are in turn covered by the electrodes 18 and 20, respectively. N+ layer 16 prevents metal migration from electrode 20 into the block 11. Positive voltage is applied to electrode 20 and negative voltage is applied to electrode 18. By applying the positive voltage to the N+ region, electrons which would otherwise diffuse into the lowly doped or I region, are prevented from doing this by the attraction of the positive voltage. Conversely, the negative voltage applied to electrode 18 attracts the holes from P+ region 14 which would migrate into block 11. If an N+ region were used instead of P+ region 14, it would not be possible to stop this electron diffusion from the negatively biased N+ region.

The P+/I/N+ embodiment of FIG. 2 allows a higher voltage to be applied by eliminating the gradient of electrons which would otherwise be injected from the metal electrodes into the I region. The effect of this gradient would be to cause the avalanche region to avalanche at a somewhat lesser field than would otherwise be the case, since the injected electrons act as "seed" carriers. Avalanche generation is caused by fields in excess of approximately $2 \times 10^5$/cm and is enhanced by a background or "seed" carrier density of electrons or electron-hole pairs. The higher voltage possible is desirable because this results in a higher rate of generation of electron-hole pairs in the avalanche region after triggering and therefore a higher ON state conductivity. Conversely, a higher voltage allows the use of a lower light flux for triggering for a given "ON" state conductivity.

FIG. 2 also shows a diagram of a circuit for controlling the BASL of the present invention. A charge line 22 and an inductor 24 are used to couple a high DC voltage source 26 to the BASL. Voltage source 26 could also be an alternating voltage source V(t) as shown in the figure. The charge line permits fast turn-off of the BASL and the inductor presents a high impedance for high frequencies to give a fast rise time for a pulse through the BASL.

The amplitude of the laser beam pulses emitted from the BASL can be varied or modulated. By controlling a variable amplifier, the intensity of the laser light projected onto block 11 is varied and thus the absorption depth is varied. By varying the absorption depth, the resistance of the block can be controlled and thus the current can be varied for a fixed DC voltage, or fixed instantaneous value of an AC voltage. Alternately, this modulation could be done by using a series of lasers of different wavelengths with each wavelength penetrating to a different distance to provide different absorption depth. The modulation could then be done by coupling the appropriate laser for the modulation value desired to a fiber optic cable. Still another alternative is to modulate the laser beam by applying differing bias voltages across the laser block.

A capacitance 28 of small value (i.e., 0.5 to 50 pf for a 0.16 mm² central active area of the semi-conductor block) may be added in parallel across the BASL device to increase the final level of avalanche multiplication, which will occur after triggering, in the avalanche region of the device. The effect of such a parallel capacitance is to maintain the electric field across the BASL device avalanche region for a longer time than would be possible in the absence of such a capacitance. By maintaining the field at a high level for a longer time, more avalanche ionization is generated (a nigher density of electron-hole pairs) and a more highly conductive "ON" state of the BASL device is achieved.

During the self-turn-off of the BASL the electron-hole pairs will recombine, taking away the charge carriers which are necessary for conduction. To promote rapid turn-off of the BASL device, the semiconductor semi-insulating region can be doped with trapping levels. An example is the doping of semi-insulating gallium arsenide with chromium or oxygen to a density of at least $10^{15}$/cm³.

Under ideal operating conditions, if a static electrical field $\epsilon$ imposed across the block (of volume V) results in a current density of J after irradiation by the pulse $h\nu_T$ (with average light power level $P_o$), the product of pulse width $\Delta t_p$ and pulse repetition frequency prf is given by $$(\Delta t_p) \text{prf} = P_O / JE \, n,$$

n=external quantum efficiency of device. Representative numbers for some of these quantities are $P_o = 200$ watts, $\Delta t_p = 10^{-9}$–$10^{-3}$sec, prf$= 10$–$2 \times 10^6$Hz, $V = 0.5$–$500$ cm³, n$= 0.2$. Certain parameters, such as J, E and V, are directly controlled by the experimenter. Control of volume V is limited at the upper end by the size of crystal boules currently obtainable to a maximum practical volume such as $V_{Max}$=approximately 500 cm³, and is limited at the lower end ($V \geq V_{min}$) by the maximum acceptable temperature rise $\Delta T_M \leq 100°$ C. This requires that the product $$C_p \Delta T_M \text{ min}$$

be less than a predetermined constant that depends upon $(\Delta t_p)$prf, $P_o$ and the radiation characteristics of the heated semiconductor material; here $C_p$ is the average specific heat capacity of the semiconductor material.

A further limitation concerns the height H of the semiconductor block in FIG. 1: H may have to be limited to no more than two cm so that the electromagnetic radiation pulse $h\nu_T$ penetrates and is absorbed throughout substantially the entire GaAs block. With H=0.5 cm and a peak radiant flux of, say, $2 \times 10^5$ watts/cm², the initial temperature rise in GaAs is estimated as $\Delta T = 87°$ K., which is near the upper limit for operation. FIG. 4 presents the practical volume range V=AH for operation of a small bulk semiconductor laser, as a function of the product $(\Delta tp)$prf, for current density J=20kA/cm² and for three different values of average light power $P_O$. Volume V scales inversely with current density so that use of a current density J=2kA/cm² will move the curves in FIG. 4 up the vertical scale by a factor of ten.

The GaAs material should preferably have resistivity=$10^7$ohm-cm and a dislocation density d$\leq 10^5$ cm⁻³. For example, such material is available from M/A-COM in Czochralski-grown, chromium-uncompensated, semi-insulating blocks. High resistivity material will minimize the possibility of thermal runaway for room temperature operation. Orientation of the GaAs crystal is also important. Electron ionization rate is significantly higher perpendicular to a (100) plane than it is perpendicular to a (111) plane; high electron ionization rate produces higher switching sensitivity (=switch current divided by radiation energy received).

For the illumination source, one may, for example, use a 500 watt laser diode array, such as the M/A-COM, Model 391, with output fed by optical fibers or other means of delivery to the GaAs block. Due to the dielectric mismatch of GaAs and air, and in the absence of anti-reflection coatings, only about 70 percent of the radiation incident upon the GaAs surface is transmitted; the remaining 30 percent is reflected or otherwise lost. Therefore, provision of metallic or non-metallic reflectors adjacent to the irradiated GaAs surface(s) may be appropriate to increase the absorption of the initiating radiation.

FIG. 5 presents a schematic view of one configuration for operation of the BASL. A block 21 of semiconductor material is mounted on a heat sink block 23, of beryllia or other suitable material with high thermal conductivity in a predetermined direction. The block 21 has an electrode grid 25 on its exposed top surface and a second electrode 27 on a parallel bottom surface. A laser diode 29 or other suitable source of electromagnetic radiation pulses produces an energy pulse $h\nu_T$ of predetermined wavelength $\lambda_T$. This radiation is guided and directed by optical fibers 31 (optional) to illuminate all or a selected portion of the exposed top surface of the block 21. The electrodes 25 and 27 have a voltage difference $\Delta V$ imposed therebetween by operation of a battery or other static or time-varying voltage source 33 at the time the energy pulse $h\nu_T$ arrives at the block 21. This radiation is substantially absorbed throughout the height H of the block 21 and produces many electrons hole pairs in the semiconductor block material (e.g., GaAs). These electrons are accelerated toward the electrode 20 (or, with voltage source polarity reversed, toward the electrode 18) by the electric field induced in the block interior by the voltage difference $\Delta V$. These accelerated electrons collide with atoms of the block material and release other previously-bound electrons, producing an avalanche of such electrons. Most or all of the conduction electrons ultimately recombine with the holes created in the semiconductor block material by promotion of valence holes to the conduction band(s). This recombination, which occurs in times of the order of 1–1,000 nsec, depending upon crystal perfection, doping and other factors, produces electromagnetic radiation $h\nu_T$ of energy substantially equal to the energy lost by the electron in the recombination process. Most or all of this energy from recombination of a single electronhole pair appears as a single photon of energy $h\nu_L$; but some portion of this energy may be carried away by phonons or other relatively low energy particles. The phonons produced by the scattering and recombination processes in the semiconductor block material can produce substantial heating of this material, which can interfere with the normal transport of electrons and photons within the block. The heat sink block 23 is intended to draw off this heat and maintain a reasonable operating temperature in the block 21.

As indicated in FIG. 1, two side walls 11c and 11d of the block 11 are cleaved or polished and are coated (optionally) with a material to facilitate emission of electromagnetic radiation of a predetermined wavelength $\lambda_L = c'/\nu_L$, where $c'$ is the velocity of light in the block material. The remaining side walls, denoted 11a and 11b in FIG. 1, are roughened and/or coated with a material that substantially absorbs, scatters diffusely or transmits radiation of wavelength $\lambda_L$. No radiation of wavelength $\lambda \sim \lambda_L$ that is incident upon these two side walls will coherently return or pass through the block 11. All of the useful radiation emitted from the block 11 will pass through the side walls 11c and/or 11d.

One or both of the side walls 11c and 11d may be thinly coated with a dielectric material that has a reflection coefficient $r(\lambda_l)$ at normal incidence and at wavelength $\lambda_L$ that satisfies $0.7 < r(\lambda_l) < 1.0$. For example, with the choices $r_{11d}(\lambda_L) = 1.0$ and $0.7 < r_{11c}(\lambda_L) < 1.0$, side wall 11d becomes a near-perfect reflector and the block functions as an optical cavity, emitting coherent electromagnetic radiation of wavelength $\lambda_L$ from side wall 11c. If both side walls 11c and 11d allow partial transmission therethrough ($r(\lambda_L) < 1.0$), radiation of wavelength $\lambda_L$ will be emitted from both 11c and 11d.

An alternative to this configuration, shown in FIG. 6, provides a reflector 41c facing side wall 11c and a substantially parallel reflector 41d facing side wall 11d. Side walls 11c and 11d are coated with an anti-reflective dielectric for the wavelengths $\lambda_L$. The system of block 11 and reflectors 41c and 41d now functions as an optical cavity if the reflection coefficients of these reflectors satisfy $r_{41c}(\lambda_L) < 1.0$ and $r_{41d}(\lambda_L) = 1.0$. Again, one might choose $r_{41c} = 1.0$ and $r_{41d} < 1.0$ so that coherent electromagnetic radiation of wavelength $\lambda_L$ is emitted "outward" only from the reflector 41d.

The choice of semiconductor material for the block 11 will substantially determine the wavelength $\lambda_L$ of radiation emitted. For the choice of GaAs, $\lambda_L = 0.84$ μm is available. Table I exhibits a number of radiation wavelengths emitted by group IV, group III-V and group II-VI semiconductor materials for electron-hole recombination in such materials, and the associated electron mobilities $\mu_e$, where available.

TABLE I

| Recombination Wavelengths and Mobilities | | |
|---|---|---|
| Material | $\lambda_r$ (μm) | $\mu_e$(cm$^2$/volt-sec) |
| C | 0.23 | 1,800 |
| ZnS | 0.32 | 120–165 |
| ZnO | 0.37 | 200 |
| ZnCdS | 0.45 | |
| ZnSe$_x$S$_{1-x}$ | 0.46 | |
| Cd$_x$Zn$_{1-x}$S | 0.46 | |
| ZnSe | 0.464 | 530 |
| CdS | 0.49 | 340 |
| CdS$_x$Se$_{1-x}$ | 0.49–0.69 | |
| GaP | 0.53 | 110 |
| ZnTe | 0.55 | 530 |
| GaSe | 0.59 | |
| GaAs$_{1-x}$P$_x$ | 0.63–0.88 | |
| CdSe | 0.68 | 800 |
| CdTe | 0.78 | 1,050 |
| In$_x$Ga$_{1-x}$As | 0.82 | |
| GaAs | 0.84, 0.87 | 8,500 |
| InP | 0.87–0.92 | 4,600 |
| Si | 1.06 | 1,500 |
| GaSb | 1.5 | 5,000 |
| AlSb | 1.55 | 900 |
| Ge | 1.88 | 3,600 |
| InAs | 2.95–3.44 | 30,000 |
| InP$_x$As$_{1-x}$ | 3.1 | |
| Te | 3.64 | |
| Hg$_x$Cd$_{1-x}$Te | 3.7–4.1 | |
| PbS | 4.26 | 600 |
| ZnSb | 4.43 | |

TABLE I-continued

| Recombination Wavelengths and Mobilities | | |
|---|---|---|
| Material | $\lambda_r$ ($\mu$m) | $\mu_e$(cm$^2$/volt-sec) |
| InSb | 5.4–7.3 | 80,000 |
| PbTe | 6.5 | 6,000 |
| Pb$_x$Sn$_{1-x}$Te | 6.5–13.5 | |
| PbSe | 8.5 | 1,000 |
| SnTe | 13.78 | |

Each of these materials may produce electromagnetic radiation by means of the invention, and each such material will have its characteristic range of trigger wavelengths $\lambda_T$.

Not all of these materials have convenient electron mobilities. The group II-VI materials, such as ZnS, ZnO, ZnSe, ZnTe, CdS$_x$Se$_{1-x}$ and Cd$_x$Zn$_{1-x}$S, have electron mobilities of 120–530 cm$^2$/volt-sec, which is 1.4–6.2 percent of the electron mobility of a material such as semi-insulating GaAs (8,500). Current density and power density are directly proportional to electron mobility so that the radiation-producing volume of a group II-VI material might have to be 16–70 times as large as the volume of a GaAs crystal to produce the same current density or power density. However, the group II-VI materials, with thermal conductivities K$_T$ of 0.01–0.2 Watts/cm$^2$–°K., have worse thermal conductivity than does GaAs (K$_T$=0.46 Watts/cm$^2$–°K.). The specific heat capacities for group II-VI materials are similar to that for GaAs (C$_p$=0.35 Joules/gm–°K.) so that the temperature rise in the group II-VI materials will be worse than the corresponding rise in GaAs, for a given power input.

The thermal expansion coefficient of GaAs is $7 \times 10^{-6}$/°K. at room temperature, which is close to the corresponding coefficient for beryllia ($9 \times 10^{-6}$/°K.) The thermal expansion coefficients of the group II-VI materials are $4–8 \times 10^{-6}$/°K. and provide good matches for beryllia. Other candidates for the heat sink material are diamond, metals such as tungsten, titanium and molybdenum, and suitable liquids such as freon, that are in contact with and flow past the block 11 on one face. Thus, materials other than GaAs, particularly the group II-VI materials, offer other advantages that may offset their smaller mobilities, vis-a-vis GaAs or other high mobility semiconductor materials.

If the block thickness H is substantial, the trigger photons of wavelength $\lambda_T$ will not be absorbed substantially uniformly throughout the thickness of the block 11. Normally, this non-uniformity would not be a problem; but if uniformity is important within the block one may operate the BASL in a two-sided embodiment, as shown in FIG. 7, where the trigger photons $h\nu_T$ simultaneously illuminate two sides 11e and 11f of a block 11 of semiconductor material, with most other arrangements being substantially the same as in FIG. 1 or 2. Alternately, if field compression is being used according to copending application Ser. No. 092,487, two trigger sources may be used if penetration to a proper fraction of the distance through the block cannot be achieved with a single trigger source.

Using a one-sided embodiment of the apparatus, the lowest order approximation for absorption and scattering of incident optical radiation (Beer's law) predicts a conventional exponential decay of photon flux $\Phi$ with distance x into the semiconductor block, viz.

$$\Phi(x) = \Phi_0 \exp(-\alpha x),$$

where $\Phi_0$ is the initial flux and $\alpha(\lambda)$ is the attenuation coefficient associated with propagation of radiation at the predetermined wavelength $\lambda$; one usually assumes that the generation rate for conduction band electrons and holes is proportional to the initial flux, for single-photon excitation. Using a two-sided embodiment and identical radiation conditions at both faces 11e and 11f in FIG. 7, he flux becomes substantially symmetric about the mid-point, viz.

$$\Phi(x) = \Phi_0[\exp(-\alpha x) + \exp(-\alpha(L-x))].$$

This will provide a more uniform flux, if desired.

Another attractive alternative here uses illumination by two lasers with different wavelengths and different initial fluxes $\Phi_1$ and $\Phi_2$ and associated attenuation coefficients $\alpha_1$ and $\alpha_2$, applied substantially simultaneously or with a predetermined time delay $\Delta t$ relative to one another. For a one-sided embodiment this produces photon flux of approximately $$\Phi(x) = \Phi_1 \exp(-\alpha_1 x) + \Phi_2 \exp(-\alpha_2 x);$$

and for a two-sided embodiment this produces $$\Phi(x) = \Phi_1 \exp(-\alpha_1 x) + \Phi_2 \exp(-\alpha_2(L-x)).$$

Representative examples of the one-sided and two-sided fluxes produced by use of two wavelengths are shown in FIG. 8. This allows one to shape or control the carrier densities near each surface (x=0 and x=L), and the approach can be extended to use more than two wavelengths and associated time delays. This approach, using two wavelengths, may allow a decrease in required initial laser power by a factor of 3–10 for the choices $\lambda_1 = 870$ nm and $\lambda_2 = 903$ nm in the two-sided embodiment for GaAs. More generally, one might choose the two wavelengths $\lambda_1$ and $\lambda_2$ so that the corresponding photon energies $h\nu$ bracket the energy gap $E_g$ of interest, viz. $h\nu_1 < E_1 < h\nu_2$.

Although the preferred embodiments have been shown and described herein, modifications may be made without departing from the scope of the invention.

What is claimed is:

1. A bulk semiconductor laser comprising:
    a block of semiconductor material;
    first and second electrodes attached to said block at separated locations on said block a predetermined distance apart;
    power supply means coupled to said electrodes for applying a high voltage, lower than a voltage required for spontaneous avalanche breakdown and high enough to result in avalanche multiplication after triggering, across said block;
    means for irradiating said block with a first amount of triggering electromagnetic radiation sufficient to produce charge carriers in said block which recombine to generate a second amount of electromagnetic radiation to produce lasing between said electrodes, said first amount of triggering electromagnetic radiation having a predetermined wavelength, said predetermined wavelength having a value which results in the majority of said first radiation penetrating through said block between said electrodes a penetration distance which is less than said predetermined distance; and first and second means for reflecting back into said block said second amount of electromagnetic radiation propagating toward first and second opposed sides of said block, respectively.

2. The laser of claim 1 wherein said means for irradiating is at least one laser diode and further comprising a fiber optic cable coupling said laser diode to said block.

3. The laser of claim 1 further comprising a second source of triggering monochromatic radiation having a wavelength which results in radiation from said second source penetrating throughout said distance.

4. The laser of claim 1 wherein said first-mentioned means for irradiating directs radiation at a top surface of said block and further comprising a second source of triggering electromagnetic radiation for directing radiation at a bottom surface of said block, said first means and said second source providing radiation with wavelengths chosen to cause substantially all of the radiation from said first means and said second source to be absorbed in a total depth less than said distance.

5. The laser of claim 1 further comprising a layer of P+ semiconductor material attached between said first electrode and said block and a layer of N+ semiconductor material attached between said second electrode and said block.

6. The laser of claim 5 wherein a positive terminal of said power supply means is coupled to said second electrode and a negative terminal of said power supply means is coupled to said first electrode.

7. The laser of claim 1 wherein said block is gallium arsenide.

8. The laser of claim 7 wherein said block is doped to be N-type or P-type with a resistivity greater than $10^6$ ohm-cm.

9. The laser of claim 1 further comprising a charge line coupled between said block and said power supply means.

10. The laser of claim 1 wherein said block is doped with trapping levels.

11. The laser of claim 10 wherein said trapping levels are one of chromium or oxygen with a density of at least $10^{15}/cm^3$.

12. The laser of claim 1 wherein at least one of said first and second electrodes is substantially transparent.

13. A bulk semiconductor laser comprising:
a block of semiconductor material;
first and second electrodes attached to said block at separated locations on said block a predetermined distance apart;
first and second reflective coatings on first and second opposed sides of said block, respectively;
power supply means coupled to said electrodes for applying a high voltage, lower than a voltage required for spontaneous avalanche breakdown and high enough to result in avalanche multiplication after triggering, across said block; and
means for irradiating said block with monochromatic electromagnetic triggering radiation having a predetermined wavelength which results in the majority of said radiation penetrating through said block between said electrodes a penetration distance which is less than said predetermined distance to produce lasing between said electrodes.

14. A method for producing lasing comprising the steps of:

providing a semiconductor block having conducting contacts attached to said block at separated locations a predetermined distance apart;
applying a high voltage across said contacts lower than a voltage required for spontaneous avalanche breakdown and high enough to result in avalanche multiplication after triggering;
irradiating said block with a first amount of triggering electromagnetic radiation sufficient to produce charge carriers by photogeneration and avalanche multiplication in said block which recombine to generate a second amount of electromagnetic radiation, said triggering electromagnetic radiation having a wavelength which causes substantially all of said first amount of radiation to be absorbed in less than said distance; and
reflecting back into said block at least some of said second amount of electromagnetic radiation propagating toward first and second opposed sides of said block to produce lasing between said contacts.

15. The method of claim 14 wherein said reflecting step comprises applying reflective coatings on said first and second opposed sides of said block.

16. The method of claim 14 wherein said reflecting step comprises providing first and second reflective planar surfaces, respectively, external to said block adjacent to said first and second opposed sides, respectively.

17. The method of claim 14 further comprising the step of irradiating said block with triggering electromagnetic radiation having a second wavelength which results in a substantial portion of said radiation being absorbed throughout said distance.

18. The method of claim 14 further comprising the step of irradiating said semiconductor block with a third amount of triggering electromagnetic radiation on a side opposite said first amount, said first and third amounts of radiation having wavelengths which cause the total penetration depth of substantially all of the radiation from said first and third amounts to be less than said distance.

19. The method of claim 14 wherein said high voltage is greater than one-tenth the D.C. avalanche breakdown voltage for said semiconductor block across said distance and less than three times said D.C. avalanche breakdown voltage.

20. The method of claim 14 wherein said step of applying a high voltage comprises applying a high voltage pulse beginning immediately prior to said irradiating step and continuing for at least a portion of the time of said irradiating step.

21. The method of claim 14 further comprising the step of providing a capacitor in parallel with said semiconductor block.

22. The method of claim 14 further comprising the step of modulating an intensity of said first amount of electromagnetic radiation.

23. The method of claim 14 further comprising the step of providing trapping levels in said semiconductor block.

24. The method of claim 14 further comprising the step of modulating the wavelength of said first amount of electromagnetic radiation.

25. The method of claim 14 further comprising the step of modulating said voltage.

* * * * *